US010530331B2

(12) United States Patent
Yamaji et al.

(10) Patent No.: US 10,530,331 B2
(45) Date of Patent: Jan. 7, 2020

(54) SURFACE ACOUSTIC WAVE ELEMENTS WITH VARYING ELECTRODE FINGER PITCH AND CONNECTION ARRANGEMENTS

(71) Applicant: SKYWORKS SOLUTIONS, INC., Woburn, MA (US)

(72) Inventors: Toru Yamaji, Nagaokakyou (JP); Rei Goto, Osaka (JP)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 72 days.

(21) Appl. No.: 15/718,679

(22) Filed: Sep. 28, 2017

(65) Prior Publication Data
US 2018/0109238 A1 Apr. 19, 2018

Related U.S. Application Data

(60) Provisional application No. 62/465,207, filed on Mar. 1, 2017, provisional application No. 62/407,585, filed on Oct. 13, 2016.

(51) Int. Cl.
H03H 9/145 (2006.01)
H03H 9/25 (2006.01)
H03H 9/64 (2006.01)

(52) U.S. Cl.
CPC .......... H03H 9/1457 (2013.01); H03H 9/25 (2013.01); H03H 9/6483 (2013.01); H03H 9/6493 (2013.01)

(58) Field of Classification Search
CPC ...... H03H 9/1457; H03H 9/25; H03H 9/6483; H03H 9/6493
See application file for complete search history.

(56) References Cited

U.S. PATENT DOCUMENTS

| 6,259,336 | B1 * | 7/2001 | Ichikawa | ............. H03H 9/6433 310/313 B |
| 2012/0188026 | A1 * | 7/2012 | Yamaji | ............... H03H 9/14535 333/133 |
| 2012/0274421 | A1 * | 11/2012 | Hara | ........................ H03H 7/38 333/195 |

* cited by examiner

Primary Examiner — Stephen E. Jones
Assistant Examiner — Samuel S Outten
(74) Attorney, Agent, or Firm — Lando & Anastasi, LLP

(57) ABSTRACT

A SAW element configured to suppress spurious emissions resulting from non-periodicity of an IDT electrode finger arrangement. In one example, the SAW element is a resonator comprising an IDT electrode including a first plurality of IDT electrode fingers connected to a first busbar and a second plurality of IDT electrode fingers connected to a second busbar, and reflectors having a plurality of reflector fingers. The pluralities of first and second IDT electrode fingers are alternatively connected to each busbar by either normal connections or reversed connections and include regions arranged by at least two different types of pitches. The normal connections are such that either the odd-numbered or even-numbered IDT electrode fingers connect to the first busbar, and the reversed connections are such that the opposite group of IDT electrode fingers connect to the first busbar.

5 Claims, 14 Drawing Sheets

SURFACE ACOUSTIC WAVE ELEMENTS WITH VARYING ELECTRODE FINGER PITCH AND CONNECTION ARRANGEMENTS

CROSS-REFERENCE TO RELATED APPLICATIONS

This application claims the benefit under 35 U.S.C. § 119(e) of U.S. Provisional Application No. 62/407,585 filed on Oct. 13, 2016 and titled "SURFACE ACOUSTIC WAVE ELEMENTS WITH VARYING ELECTRODE FINGER PITCH AND CONNECTION ARRANGEMENTS," and of U.S. Provisional Application No. 62/465,207 filed on Mar. 1, 2017 and titled "SURFACE ACOUSTIC WAVE ELEMENTS WITH VARYING ELECTRODE FINGER PITCH AND CONNECTION ARRANGEMENTS," each of which is herein incorporated by reference in its entirety for all purposes.

BACKGROUND

Filters, in particular high-frequency filters, are used in a wide variety of electronic devices for many different applications and functions. For example, filters can be used to separate signals having different bands, such as a transmission signal and a reception signal, for example. One common implementation of a high-frequency filter that is used in wireless communications devices, for example, in the antenna duplexer of such devices, is a ladder-type filter such as that shown in FIG. 1.

FIG. 1 is a circuit diagram showing a configuration of an example of a ladder-type filter 100. The ladder-type filter 100 includes a plurality of series-arm resonators 104a-d connected in series with one another along a signal path between an input terminal 102 and an output terminal 103. The ladder-type filter 100 further includes a plurality of parallel-arm resonators 105a-c which connect respective nodes between the series-arm resonators 104a-d along the signal path to a ground via an inductor 106. In various examples, the series-arm resonators 104a-104d and the parallel-arm resonators 105a-105c of filter 100 may each be formed by one or more surface acoustic wave (SAW) elements. The SAW elements may include a resonator including an interdigital transducer (IDT) electrode and a pair of reflectors, all of which may be formed on a piezoelectric substrate made of lithium niobate or lithium tantalite, for example.

FIG. 2 is a diagram showing an electrode arrangement of a first example of a conventional SAW element 200. The top portion of FIG. 2 shows a plan view of the first conventional SAW element 200 including an interdigital transducer (IDT) electrode 210 and a pair of reflectors 220 disposed on either side of the IDT electrode. The IDT electrode 210 is formed by a pair of interdigitated comb-shaped electrodes. Each interdigitated comb-shaped electrode includes a busbar 212a, 212b, and a plurality of electrode fingers 214 extending therebetween. Adjacent electrode fingers 214 are alternately connected to the first busbar 212a or the second busbar 212b and interdigitate with one another. Each reflector 220 of the pair of reflectors includes a plurality of interdigitated reflector fingers 222.

The lower portion of FIG. 2 is a graph showing the electrode finger "pitch" (represented by P(x)) in the various regions of the first conventional SAW element 200. The horizontal axis of the graph represents the x-direction, which is the direction in which a surface acoustic wave propagates through the SAW element 200, and the vertical axis represents the pitch. As shown, in the first conventional SAW element 200, the electrode fingers 214 of the IDT electrode 210 are arranged with a first pitch P1, whereas the electrode fingers 222 of the reflectors 220 are arranged with a second pitch P2 greater than the first pitch P1.

FIG. 3 is an enlarged cross-sectional view of a part the first conventional SAW element 200, including a portion of the IDT electrode 210, taken along the x-direction and a thickness direction of a piezoelectric substrate 230 on which the IDT electrode 210 is formed. As shown, the electrode finger pitch P(x) can be defined as a distance from one side of an electrode finger 214b to a corresponding side of an adjacent electrode finger 214a of the IDT electrode. The same definition of pitch is applicable to the electrode fingers 222 of the reflectors 220 shown in FIG. 2. Thus, a greater pitch means that the electrode fingers 214 or 222 are spaced further apart from one another relative to a lesser pitch.

During operation, the IDT electrode 210 within the SAW element 200 is provided with an excitation voltage having one or more frequency components. The resonance characteristics of the SAW element 200 affect its response to the various frequency components of the excitation voltage. Specifically, the amount of impedance presented by the SAW element 200 varies with frequency in accordance with its resonance characteristics, and in turn determines the amount of signal attenuation at various excitation voltage frequencies.

The resonance characteristics of a SAW element are determined in part by its resonant frequency and antiresonant frequency. Excitation voltage frequencies close to the resonant frequency of the SAW element experience a relatively low amount of signal attenuation through the SAW element. A relatively narrow frequency band around the resonant frequency can be referred to as the "main lobe" of the frequency response (i.e., signal attenuation as a function of frequency) of the SAW element. In contrast, excitation voltage frequencies near the antiresonant frequency of the SAW element experience a relatively high amount of signal attenuation through the SAW element. The frequency response of the SAW element may additionally include one or more "side-lobes" corresponding to frequency bands in which excitation voltages experience an intermediate amount of signal attenuation through the SAW element, the amount being greater than that of the main-lobe, but still relatively low. Accordingly, excitation voltage frequencies within the main-lobe or side-lobes are significantly less attenuated by the SAW element than other excitation voltage frequencies.

Techniques for controlling the electromechanical coupling coefficient of a SAW element can be applied to alter its resonance characteristics, which affect its overall frequency response, as described above. For example, one technique for altering the electromechanical coupling coefficient of the SAW element 200 is to remove some of the electrode fingers 214 from the IDT electrode 210. The number and location(s) of the electrode fingers 214 that are removed can be selected so as to apply a "weighting" to suppress a first side-lobe of the frequency response of the SAW element 200.

FIG. 4 is a diagram showing an electrode arrangement of a second example of a conventional SAW element 300. The top portion of FIG. 4 shows a plan view of the second conventional SAW element 300 including an IDT electrode 310 and a pair of reflectors 320 disposed on either side of the IDT electrode. The second conventional SAW element 300 is similar to the first conventional SAW element 200 shown in FIG. 2, except for the addition of a technique of reversing the connections of some electrode fingers 314, as described below. Similar to FIG. 2, the lower portion of FIG. 4 is a graph showing the electrode finger pitch along the x-direction. As shown, in the second conventional SAW element 300, the electrode fingers 314 of the IDT electrode 310 are arranged with a first pitch P1, whereas the electrode fingers 322 of the reflectors 320 are arranged with a second pitch P2 greater than the first pitch P1.

The IDT electrode 310 of the second conventional SAW element 300 includes two regions 313 in which the electrode finger connections are reversed relative to the remaining region 311 of the IDT electrode 310. These "reversed regions" 313 are arranged symmetrically along the x-axis between the points m±d1 and each respective end of the IDT electrode 310. In the reversed regions 313, the electrode finger connections to the first busbar 312a and the second busbar 312b are reversed relative to the "normal region" 311. The reversed regions 313 begin at the points m±d1 along the x-axis and extend outward in each x-direction to the respective ends of the IDT electrode 310. In the reversed regions 313, the alternating pattern of electrode finger 314 connections established in the "normal region" 311 is inverted. Specifically, the first IDT electrode finger 314 in each reversed region 313 after crossing boundary m+d1 or m−d1 connects to the same busbar 312a, 312b as each previous IDT electrode finger 314 in the normal region 311 adjacent to the boundary. In other words, at each boundary m+d1, m−d1 there is a single repetition in the pattern of electrode finger connections that deviates from the alternating pattern of finger connections established in the normal region 311. The electrode fingers 314 having the reversed connections are hatched for clarity. The remaining elements are identical to those of the conventional SAW element 200 shown in FIG. 2.

FIG. 5 is a graph comparing resonance characteristics of the conventional SAW elements 200 and 300 shown in FIG. 2 and FIG. 4, respectively. The horizontal axis represents frequency, and the vertical axis represents the imaginary part of the impedance (reactive impedance) presented by each SAW element. In FIG. 5, the solid line A indicates the resonance characteristics of the conventional SAW element 200 of the first example (FIG. 2), whereas the dashed line B indicates the resonance characteristics of the conventional SAW element 300 of the second example (FIG. 4). The antiresonant frequency $f_B$ associated with the second SAW element 300 is shifted toward lower frequencies with respect to the antiresonant frequency $f_A$ associated with the first SAW element 200. Further, spurious emissions S can be observed in some regions of lower frequencies for the second conventional SAW element 300. These spurious emissions S result from non-periodicity caused by the reversed connections of the electrode fingers 314 implemented in the second conventional SAW element 300 of FIG. 4.

FIGS. 6A-6B are a set of graphs showing frequency characteristics of two examples of the ladder-type filter 100 implemented using the conventional SAW elements 200 and 300 shown in FIG. 2 and FIG. 4, respectively. In FIG. 6A, the solid line A indicates frequency characteristics of a first example of the filter 100 implemented using the conventional SAW element 200 of the first example (FIG. 2) as the series-arm resonators 104a-104d and as the parallel-arm resonators 105a-105c. The dashed line B indicates frequency characteristics of a second example of the filter 100 in which the series-arm resonators 104a-104d are each replaced with the conventional SAW element 300 of the second example (FIG. 4).

In FIG. 6A, a passband R1 and a stopband R2 of the examples of the filter 100 are shown. The second example of the filter 100, indicated by the dashed line B, shows an improvement of signal level in the stopband R2 compared to the first example of the filter 100 indicated by the solid line A. In particular, the stopband R2 of the second example of the filter 100 begins closer to the passband R1, or at a lower frequency, relative to the first example of the filter 100, as may be seen by comparing solid line A and dashed line B, and the corresponding signal level reaches an attenuation level of around −50 [dB] at a lower frequency relative to the first example of the filter.

FIG. 6B shows an enlarged view of a portion of the frequency range depicted in FIG. 6A, including the passband R1 of the second example of the filter 100. As can be seen in the passband R1, spurious emissions S occur in the second example of the filter 100, which uses the conventional SAW elements 300 of FIG. 4 (indicated by the dashed line B). As discussed above, these spurious emissions S result from non-periodicity caused by the inclusion of reversed IDT electrode finger connections in the reversed regions 313.

SUMMARY OF INVENTION

Aspects and embodiments relate to a surface acoustic wave (SAW) element and a filter including at least one SAW element.

As discussed above, the technique of reversing the connections of some of the electrode fingers in the IDT electrodes of the SAW element 300 (shown in FIG. 4) can provide improvements in the frequency response of a filter using such SAW elements (e.g., moving the stopband R2 closer to the passband R1, which can improve isolation characteristics when the filter is used in a duplexer, for example), but causes undesirable spurious emissions in the filter passband. Spurious emissions cause the SAW element to concentrate power at certain frequencies, which can alter resonance characteristics and harm electric power durability by placing excessive strain on internal components. Thus, there is a need for an improved SAW element.

In view of the above described problem, certain aspects and embodiments provide an improved SAW element, and filters incorporating the improved SAW element, which not only have improved frequency response characteristics, similar to the SAW element 300 discussed above, but are also configured to suppress spurious emissions otherwise resulting from non-periodicity in the electrode finger connections, and may achieve desired downsizing of devices in which they are used. As discussed in more detail below, according to certain embodiments, an improved SAW element is achieved using a combination of reversed electrode finger connections and varying electrode finger pitch in different regions of the IDT electrode of the SAW element.

Various aspects and embodiments disclosed herein describe a SAW element including a piezoelectric substrate and interdigital transducer (IDT) electrode formed on the piezoelectric substrate. The IDT electrode includes a plurality of electrode fingers, a first busbar, and a second busbar. The IDT electrode further includes a first region in which the plurality of electrode fingers of the IDT electrode are connected to the first and second busbars by normal connections and a second region in which the plurality of electrode fingers are connected to the first and second busbars by reversed connections. The normal connections may be such that the odd-numbered electrode fingers, sequentially counted from one end of the IDT electrode in a propagation direction of a surface acoustic wave and excited by the IDT electrode, are connected to the first busbar and the even-numbered electrode fingers are connected to the second busbar. The reversed connections may be such that the odd-numbered electrode fingers are connected to the second busbar and the even-numbered electrode fingers are connected to the first busbar. In certain examples the plurality of electrode fingers is arranged with a first pitch in the first region and a second pitch in the second region, the second pitch being different from the first pitch. The SAW element may further include a pair of reflectors disposed opposing one another on opposite sides of the IDT electrode in the propagation direction on the piezoelectric substrate.

According to another embodiment, a ladder-type filter includes an input and an output, a piezoelectric substrate, a plurality of series-arm resonators formed on the piezoelectric substrate and connected in series along a signal path between the input and the output, and a plurality of parallel-arm resonators formed on the piezoelectric substrate and connected between the signal path and a reference potential. At least one of the series-arm resonators is implemented using a surface acoustic wave element including an interdigital transducer (IDT) electrode formed on the piezoelectric substrate and configured to excite an acoustic wave, and a pair of reflectors disposed opposing one another on the piezoelectric substrate on opposite sides of the IDT electrode in a propagation direction of the acoustic wave. The IDT electrode has a plurality of electrode fingers, a first busbar, and a second busbar. The IDT electrode is configured with a first region in which the plurality of electrode fingers of the IDT electrode are connected to the first and second busbars by normal connections, and a second region in which the plurality of electrode fingers are connected to the first and second busbars by reversed connections. The normal connections have odd-numbered electrode fingers sequentially counted in the propagation direction from one end of the IDT electrode connected to the first busbar and even-numbered electrode fingers connected to the second busbar, and the reversed connections have the odd-numbered electrode fingers connected to the second busbar and the even-numbered electrode fingers connected to the first busbar. In certain examples the plurality of electrode fingers are arranged with a first pitch in the first region and a second pitch in the second region, the second pitch being different from the first pitch.

In one example of the ladder-type filter each of the series-arm resonators is implemented using the surface acoustic wave element. In another example of the ladder-type filter at least one of the parallel-arm resonators is implemented using the surface acoustic wave element. In another example of the ladder-type filter each of the parallel-arm resonators is implemented using the surface acoustic wave element.

Another embodiment is directed to a front-end module including an antenna duplexer having an input node, an output node, and a common node. The antenna duplexer includes a transmission filter connected between the input node and the common node, and a reception filter connected between the common node and the output node, at least one of the transmission filter and the reception filter including at least one surface acoustic wave element formed on a piezoelectric substrate. The at least one surface acoustic wave element includes an interdigital transducer (IDT) electrode configured to excite an acoustic wave, and a pair of reflectors disposed opposing one another on opposite sides of the IDT electrode in a propagation direction of the acoustic wave. The IDT electrode has a plurality of electrode fingers, a first busbar, and a second busbar. The IDT electrode is configured with a first region in which the plurality of electrode fingers of the IDT electrode are connected to the first and second busbars by normal connections, and a second region in which the plurality of electrode fingers are connected to the first and second busbars by reversed connections, the normal connections having odd-numbered electrode fingers sequentially counted in the propagation direction from one end of the IDT electrode connected to the first busbar and even-numbered electrode fingers connected to the second busbar, and the reversed connections having the odd-numbered electrode fingers connected to the second busbar and the even-numbered electrode fingers connected to the first busbar. In certain examples the plurality of electrode fingers are arranged with a first pitch in the first region and a second pitch in the second region, the second pitch being different from the first pitch.

In one example the front-end module further includes a transmitter circuit connected to the input node of the antenna duplexer, and a reception circuit connected to the output node of the antenna duplexer. The front-end module may further include a phase shifting element connected to the common node. In one example the phase shifting element is an inductor.

According to another embodiment a wireless device includes an antenna, a baseband sub-system, and a front-end module connected between the antenna and the baseband sub-system. The front end module includes an antenna duplexer having a common node coupled to the antenna, an input node, and an output node. The antenna duplexer includes a transmission filter connected between the input node and the common node, and a reception filter connected between the common node and the output node. At least one of the transmission filter and the reception filter includes at least one surface acoustic wave element formed on a piezoelectric substrate. The at least one surface acoustic wave element includes an interdigital transducer (IDT) electrode configured to excite an acoustic wave, and a pair of reflectors disposed opposing one another on opposite sides of the IDT electrode in a propagation direction of the acoustic wave. The IDT electrode has a plurality of electrode fingers, a first busbar, and a second busbar. The IDT electrode is configured with a first region in which the plurality of electrode fingers of the IDT electrode are connected to the first and second busbars by normal connections, and a second region in which the plurality of electrode fingers are connected to the first and second busbars by reversed connections, the normal connections having odd-numbered electrode fingers sequentially counted in the propagation direction from one end of the IDT electrode connected to the first busbar and even-numbered electrode fingers connected to the second busbar, and the reversed connections having the odd-numbered electrode fingers connected to the second busbar and the even-numbered electrode fingers connected to the first busbar. In certain examples the plurality of electrode fingers are arranged with a first pitch in the first region and a second pitch in the second region, the second pitch being different from the first pitch.

In one example of the wireless device the front-end module further includes a transceiver coupled to the input node and the output node of the antenna duplexer. The front-end module may further include a power amplifier connected between the transceiver and the input node of the antenna duplexer. The front-end module may further include a low noise amplifier connected between the transceiver and the output node of the antenna duplexer. In another example the front-end module further includes an antenna switch connected to the common node of the antenna duplexer. In one example the wireless device further includes an antenna connected to the antenna switch. The wireless device may further include a power management sub-system connected to the transceiver. In another example the wireless device further includes a battery connected to the power management subsystem. In another example the wireless device further includes a memory connected to the power management subsystem. The wireless device may further include a baseband subsystem connected to at least one of the memory, the power management subsystem, and the transceiver.

In one example the each reflector of the pair of reflectors includes a plurality of reflector fingers arranged with a third pitch different from the first and second pitches. In one example the second pitch is greater than the first pitch. In another example the third pitch is greater than the second pitch.

In one example the first and second regions are symmetrically arranged with respect to a single reference position in the IDT electrode along the propagation direction. The reference position may be a mid-point of the IDT electrode along the propagation direction, for example.

In one example the first region extends symmetrically from the reference position to a pair of first points located a first distance away from the reference position along the propagation direction, and the second region extends from each first point to a respective end of the IDT electrode.

In one example the first region has a first width in the propagation direction and the second region has a second width in the propagation direction, the first width being greater than the second width.

In another example the IDT electrode further includes a third region in which the electrode fingers are connected to the first and second busbars by the normal connections, the first region extending symmetrically from the reference position to a pair of first points located a first distance away from the reference position along the propagation direction, the third region extending from each first point to a corresponding one of a pair of second points located a second distance away from the reference position along the propagation direction, and the second region extending from each second point to a respective end of the IDT electrode. In one example the electrode fingers in the third region are arranged with a varying pitch. The varying pitch may vary linearly with distance from the reference position from the first pitch at each first point to a fourth pitch at each second point, the fourth pitch being less than the first pitch.

In another example the IDT electrode further includes a third region in which the electrode fingers are connected to the first and second busbars by the reversed connections. The IDT electrode may further include a fourth region in which the electrode fingers are connected to the first and second busbars by the normal connections. In one example the third and fourth regions are arranged symmetrically with respect to the reference position. In one example the third region extends symmetrically from the reference position to a pair of first points located a first distance away from the reference position along the propagation direction, the first region extends from each first point to a corresponding one of a pair of second points located a second distance away from the reference position along the propagation direction, the fourth region extends from each second point to a corresponding one of a pair of third points located a third distance away from the reference position along the propagation direction, and the second region extends from each third point to a respective end of the IDT electrode. In one example the electrode fingers in the third region are arranged with the first pitch. In another example electrode fingers in the fourth region are arranged with a varying pitch. The varying pitch may vary linearly with distance from the reference position from the first pitch at each second point to a fourth pitch at each third point, the fourth pitch being less than the first pitch.

In certain example the varying pitch varies continuously or stepwisely with distance along the propagation direction.

According to various examples the piezoelectric substrate is made of lithium niobate or lithium tantalite.

According to another embodiment, a surface acoustic wave element includes a piezoelectric substrate, an interdigital transducer (IDT) electrode formed on the piezoelectric substrate, and a pair of reflectors disposed on the piezoelectric substrate opposing one another on opposite sides of the IDT electrode in a propagation direction of a surface acoustic wave excited by the IDT electrode. The IDT electrode includes a plurality of electrode fingers, a first busbar, and a second busbar. The IDT electrode further includes a first region in which the plurality of electrode fingers of the IDT electrode are connected to the first and second busbars by normal connections, and a second region in which the plurality of electrode fingers are connected to the first and second busbars by reversed connections. The normal connections have odd-numbered electrode fingers sequentially counted from one end of the IDT electrode in the propagation direction connected to the first busbar and even-numbered electrode fingers connected to the second busbar, and the reversed connections have the odd-numbered electrode fingers connected to the second busbar and the even-numbered electrode fingers connected to the first busbar. In certain examples the plurality of electrode fingers are arranged with a first pitch in the first region and a varying pitch in the second region.

In one example of the acoustic wave element the first and second regions are symmetrically arranged with respect to a single reference position in the IDT electrode along the propagation direction. The reference position may be a mid-point of the IDT electrode along the propagation direction, for example. In one example the each reflector of the pair of reflectors includes a plurality of reflector fingers arranged with a second pitch greater than the first pitch. In another example the first region extends symmetrically from the reference position to a pair of first points located a first distance away from the reference position along the propagation direction, and the second region extends from each first point to a respective end of the IDT electrode. In one example the first region has a first width in the propagation direction and the second region has a second width in the propagation direction, the first width being greater than the second width. In another example the varying pitch varies linearly with distance from the reference position from the first pitch at each first point to a third pitch at end of the IDT electrode, the third pitch being less than the first pitch. In another example each reflector of the pair of reflectors includes a plurality of reflector fingers arranged with a second pitch greater than the first pitch. The varying pitch may vary between the first pitch and a third pitch, the third pitch being smaller than the first pitch. The varying pitch may vary continuously or stepwisely with distance from the reference position.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments are directed to SAW elements and filters implemented using the SAW elements. In addition, aspects and embodiments are directed to modules and electronic devices incorporating the filters.

As discussed above, conventional ladder-type filters, such as examples of the ladder-type filter 100 implemented using conventional SAW elements 300 as the series-arm resonators 104, can achieve improved attenuation characteristics, but produce undesirable spurious emissions that degrade the passing characteristics and the electric power durability of the filter. Accordingly, aspects and embodiments provide SAW elements that are configured to provide the benefits associated with the conventional SAW element 300, and also to suppress the spurious emissions associated with the conventional SAW element 300. Using the SAW elements according to aspects and embodiments disclosed herein can achieve filters, and electronic devices incorporating these filters, having improved performance. For example, the improved SAW elements according to certain embodiments can be used as the series-arm resonators in a ladder-type filter, such as that shown in FIG. 1, to form an improved ladder-type filter capable of suppressing spurious emissions and exhibiting improved attenuation characteristics.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 7:
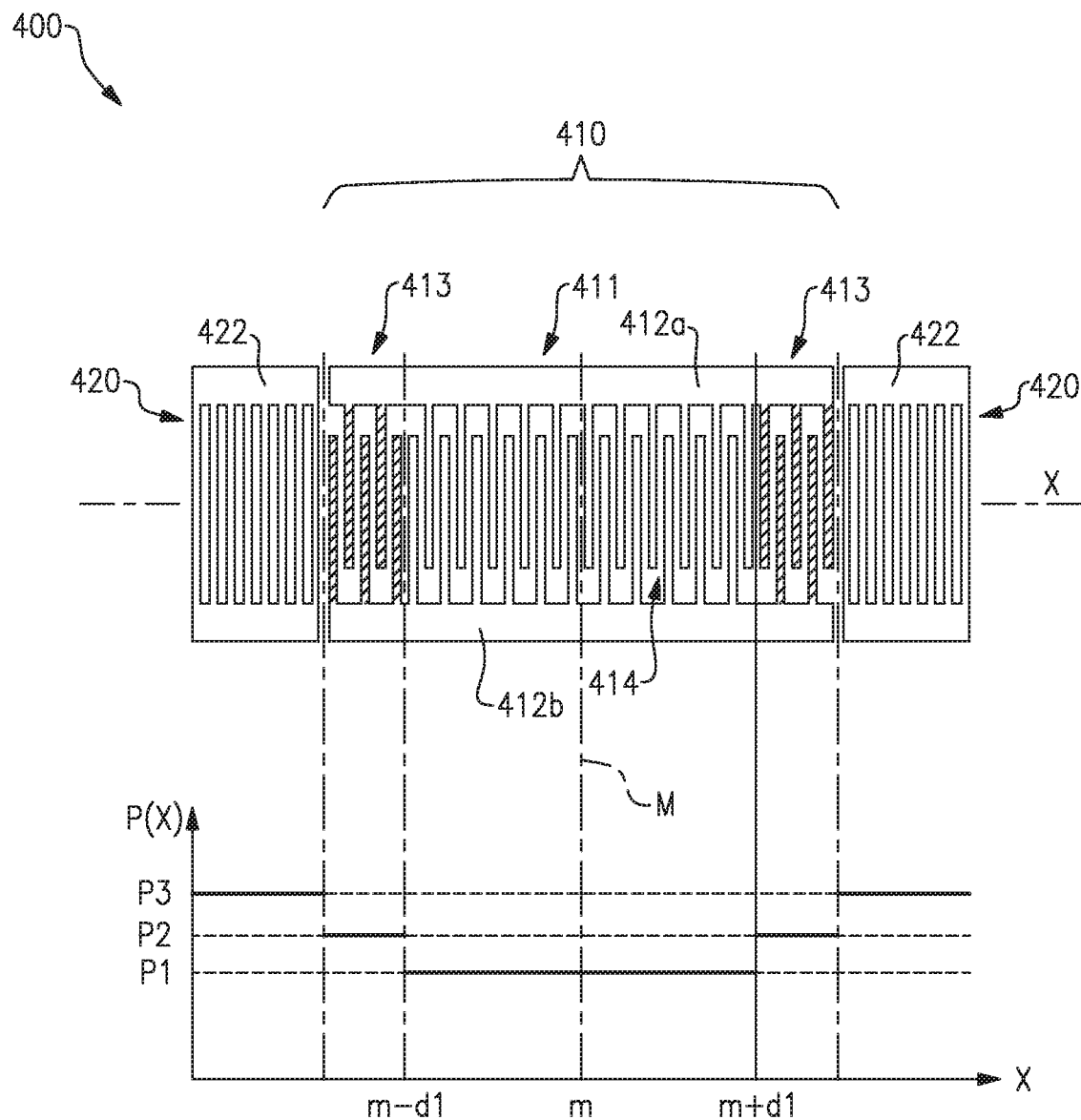
FIG. 7 is a diagram showing an electrode arrangement of an improved SAW element according to aspects of the present disclosure.

Referring to FIG. 7 there is illustrated an electrode arrangement of one example of a SAW element according to one embodiment. The top portion of FIG. 7 shows a plan view of the SAW element 400, and the lower portion of FIG. 7 is a graph showing a distribution of pitches, P(x), of the electrode fingers in certain regions of the SAW element. As noted above, it is to be appreciated that FIG. 7 is not drawn to scale. The SAW element 400 includes a piezoelectric substrate (not shown), an interdigital transducer (IDT) electrode 410 formed on the piezoelectric substrate, and a pair of reflectors 420 disposed on either side of the IDT electrode 410 on the piezoelectric substrate. The IDT electrode 410 includes a pair of interdigitated electrodes, each including a plurality of electrode fingers 414 connected to a busbar 412a or 412b and extending between the busbars 412a, 412b, as shown in the upper portion of FIG. 7. One of the busbars 412a, 412b can be connected to a signal source that supplies an excitation voltage for the IDT electrode 410, and the other can be connected to a reference potential, such as ground. The electrode fingers 414 of the IDT electrode 410 each have a certain width and are arranged with certain pitches, P(x), along the x-direction to excite a surface acoustic wave of a certain wavelength when supplied with the excitation voltage. As discussed above, the pitch refers to the spacing between adjacent electrode fingers, and the greater the pitch the further apart the electrode fingers are spaced from one another. The x-direction corresponds to the propagation direction of the surface acoustic wave through the IDT electrode 410. The reflectors 420 each include a plurality of reflector electrode fingers 422 having a certain width and arranged with a certain pitch along the x-direction. The reflectors 420 are configured to reflect the surface acoustic wave excited by the IDT electrode 410 and form a resonant structure.

As shown in FIG. 7, in the IDT electrode 410, adjacent electrode fingers 414 are alternately connected to the first busbar 412a or the second busbar 412b. In various embodiments, the IDT electrode 410 includes at least three regions, each region having either "normal" or "reversed" electrode finger connections. The electrode fingers 414 within each region have a certain pitch, which can be different among different regions, as discussed further below. Similar regions may be symmetrically arranged with respect to a single reference position in the IDT electrode 410 along the propagation direction x. In the example shown in FIG. 7, the IDT electrode 410 has a "normal" region 411 and two "reversed" regions 413 disposed on either side of the normal region.

In one example, the "normal" region 411 has normal connections such that odd-numbered electrode fingers 414, sequentially counted from one end of the IDT electrode 410 in the x-direction, are connected to the first busbar 412a and even-numbered electrode fingers 414, sequentially counted from the same end of the IDT electrode 410 in the x-direction, are connected to the second busbar 412b. In contrast, in the "reversed" regions 413, the electrode fingers 414 have reversed connections, such that the even-numbered electrode fingers are connected to the first busbar 412a and the odd-numbered electrode fingers are connected to the second busbar 412b (using the same sequential counting from the end of the IDT in the x-direction). The reversed regions 413 are created by interrupting the pattern of alternatingly connected IDT electrode fingers 414 at the boundary between each normal region 411 and each reversed region 413, such that the electrode fingers directly adjacent to each boundary connect to the same busbar 412a or 412b.

Referring to FIG. 7, in accord with various embodiments, in the normal region 411, counting from a fixed point m on the x-axis towards either end of the IDT electrode 410, the connections of the IDT electrode fingers 414 are such that from left-to-right the odd-numbered electrode fingers are connected to the top busbar 412a and the even-numbered electrode fingers are connected to the bottom busbar 412b. Similarly, counting successively right-to-left from point m in the normal region 411, the odd-numbered electrode fingers are connected to the bottom busbar 412b and the even-numbered electrode fingers are connected to the top busbar 412a. In some embodiments, point m may be a midpoint along the x-axis, but in other embodiments point m may be offset in either x-direction relative to the midpoint.

Still referring to FIG. 7, in addition to the normal region 411, there are also reversed regions 413 in which the electrode finger 414 have reversed connections. The reversed regions 413 begin at the boundaries m+d1 and m−d1 and span in each direction along the x-axis until terminating at each end of IDT electrode 710 (where each reflector 420 begins). In the reversed regions 413, the alternating pattern of IDT finger 414 connections established in the normal region is inverted. Specifically, the first IDT electrode finger 414 in each reversed region after crossing boundary m+d1 or m−d1 connects to the same busbar 412a, 412b as each previous IDT electrode finger 414 in the normal region 411 directly adjacent to the boundary. In other words, at each boundary m+d1, m−d1 there is a single repetition in the pattern of finger 414 connections that deviates from the alternating pattern of finger connections established in the normal region 411. The IDT electrode fingers 414 in the reversed regions 413 are hatched in FIG. 7 for illustrative purposes.

In certain embodiments, the normal region 411 and reversed regions 413 are arranged symmetrically with respect to the symmetry axis M passing through the reference position m corresponding to the x-direction midpoint of the SAW element 400. However, in other embodiments, the various regions may be arranged asymmetrically relative to an axis, the axis intersecting a reference position that may be located at a position along the x-axis offset from the midpoint m of the SAW element 400. In the example shown in FIG. 7, the normal region 411 of the IDT electrode 410 extends symmetrically from the reference position m to points of distance d1 away therefrom. The reversed regions 413 extend in the x-direction beyond the points m±d1 to each end of the IDT electrode 410. In one example the combined width of the reversed regions 413 is substantially less than the width the normal region 411 along the x-direction.

In addition to the electrode finger connections being different between the normal region 411 and the reversed regions 413 of the IDT electrode 410, the electrode fingers 414 in each region may have a different pitch. Still referring to FIG. 7, in one embodiment, the electrode fingers 414 of the IDT electrode 410 in the normal region 411 are arranged with a first pitch, P1, and the electrode fingers 414 of the IDT electrode 410 in the reversed regions 413 are arranged with a second pitch P2. The reflector electrode fingers 422 of the reflectors 420 are arranged with a third pitch P3. In the example illustrated in FIG. 7, the third pitch is larger than the second pitch, which is larger than the first pitch (P3>P2>P1). In other words, the electrode fingers 414 in the normal region 411 are spaced more closely together than are the electrode fingers 414 in the reversed regions 413. Further, the reflector electrode fingers 422 are spaced further apart from one another than are the electrode fingers 414 of the IDT electrode 410. In one example, each of the pitches P(x) are constant within the respective regions; however in other examples one or more of the pitches may be a variable pitch that varies as a function of position along the x-direction, as discussed further below. The electrode finger pitch within a variable pitch region may vary discretely or continuously based on distance relative each region boundary.

Those skilled in the art will appreciate that in various embodiments each IDT electrode 410 may be constructed to have a different number of electrode fingers 414, pitch P(x), electrode finger length, or electrode finger width than what are shown in FIG. 7 based on various design parameters. Similarly, in various embodiments, each reflector 420 may be constructed to have a different number of reflector electrode fingers 422, pitch P(x), reflector electrode finger length, or reflector electrode finger width than what are shown in FIG. 7 based on various design parameters.

According to one embodiment, the SAW element 400 (FIG. 7) having reversed regions 413 surrounding a normal region 411 has an improved electromechanical coupling coefficient relative to the conventional SAW element 200 (FIG. 2) without the reversed connections. In particular, by using the reversed regions 413, the electromechanical coupling coefficient can be controlled to adjust the antiresonant frequency, thereby improving the attenuation level and consequently the frequency characteristics of a filter in which the SAW element 400 is used. In addition, the problem of undesirable spurious emissions associated with the conventional SAW element 300 discussed above is addressed by using the different electrode finger pitches within different regions of the SAW element 400. Specifically, by configuring the reversed regions 413 to have an electrode finger pitch P2 greater than the electrode finger pitch P1 in the normal region 411, and configuring the reflectors 420 to have a reflector electrode finger pitch P3 greater than electrode finger pitch P2 of the reversed regions 413, the occurrence of spurious emissions in the passband of a filter using the SAW element 400 is suppressed.

Figure 4:
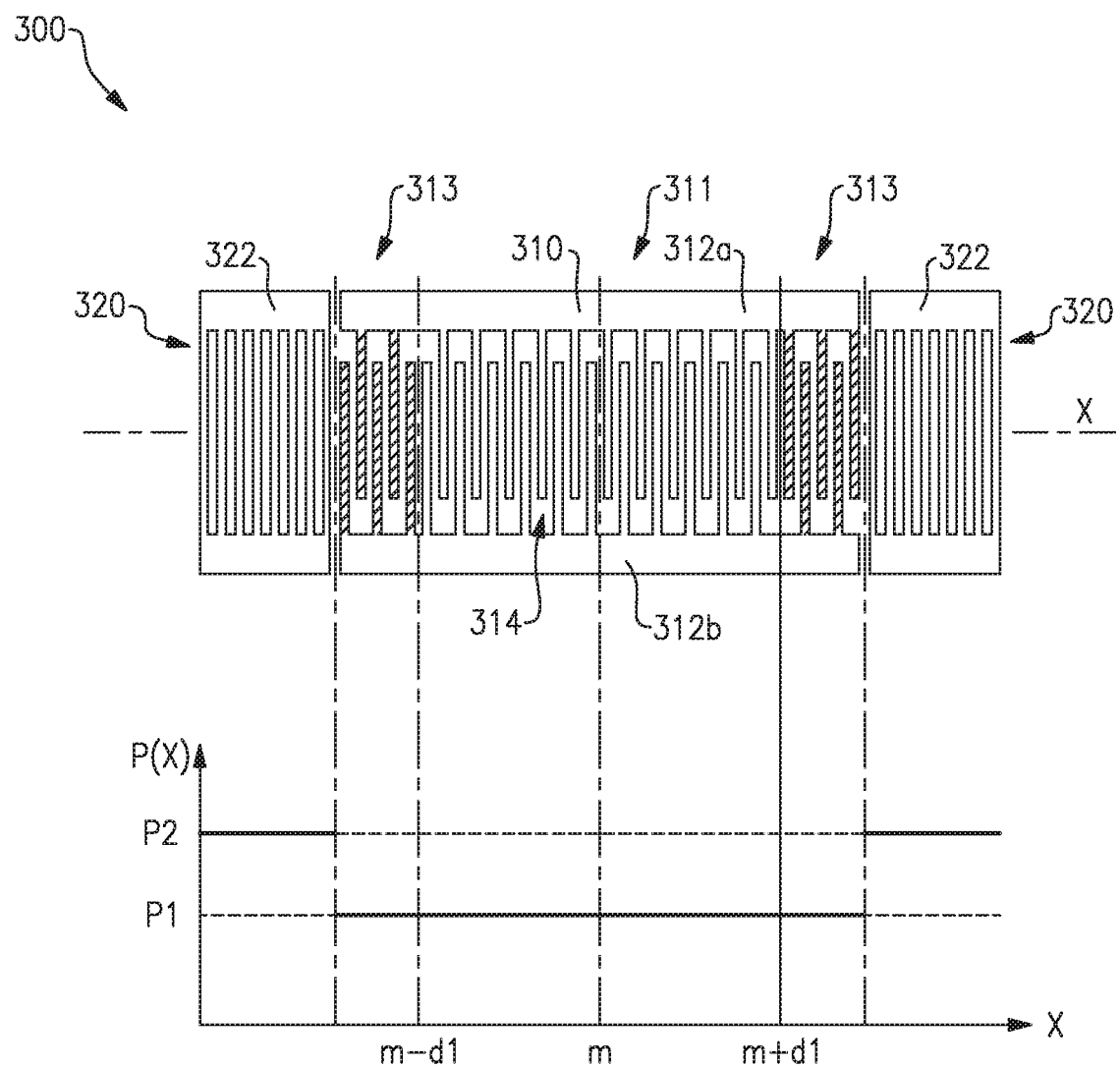
FIG. 4 is a diagram showing an electrode arrangement of a second example of a conventional SAW element.
Figure 5:
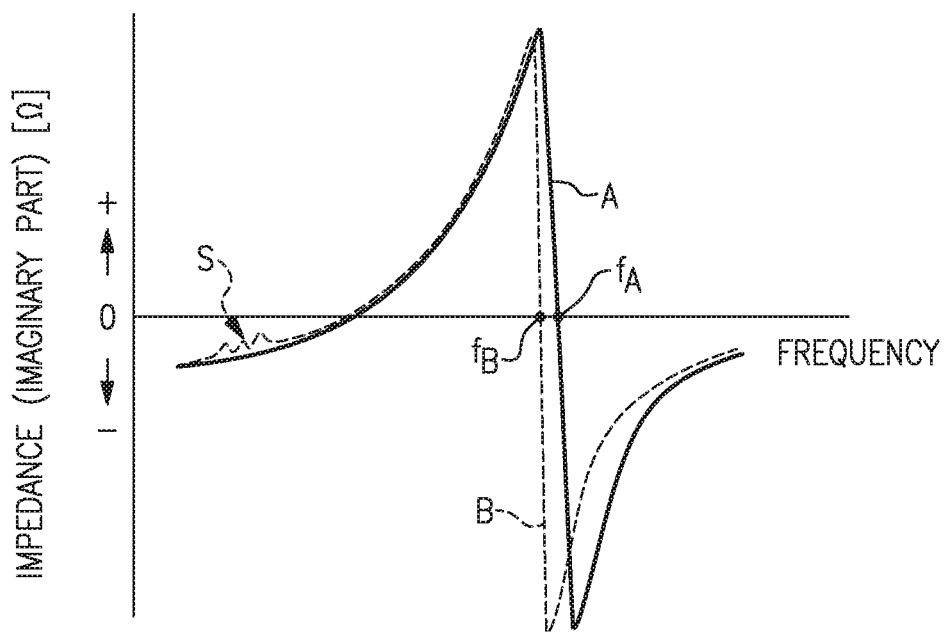
FIG. 5 is a graph depicting resonance characteristics of the conventional SAW elements shown in FIG. 2 and FIG. 4.
Figure 8:
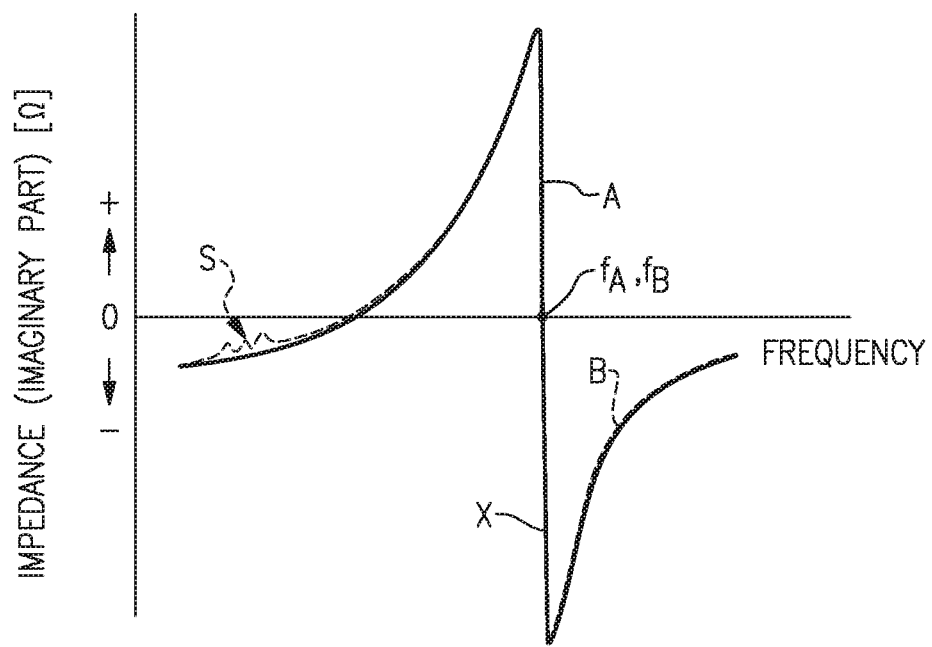
FIG. 8 is a graph showing comparative resonance characteristics the SAW elements depicted in FIG. 4 and FIG. 7.

FIG. 8 is a graph comparing resonance characteristics of an embodiment of the SAW element 400 shown in FIG. 7 to the resonance characteristics of the conventional SAW element 300 of the second example shown in FIG. 4. The horizontal axis represents frequency, and the vertical axis represents the imaginary part of impedance (reactive impedance) presented by each SAW element. The solid line A indicates the resonance characteristics of the embodiment of the SAW element 400. For comparison purposes, the dashed line B indicates the resonance characteristics of the conventional SAW element 300.

The antiresonant frequency $f_A$ associated with the embodiment of the SAW element 400 (corresponding to the solid line A) substantially matches the antiresonant frequency $f_B$ associated with the conventional SAW element 300 (corresponding to the dashed line B). As indicated by the solid line A, no or negligible spurious emissions occur in the embodiment of the SAW element 400. In contrast, as indicated by the dashed line B, in the conventional SAW element 300 the occurrence of spurious emissions S can be seen at certain frequencies lower than the antiresonant frequency $f_B$.

Figure 2:
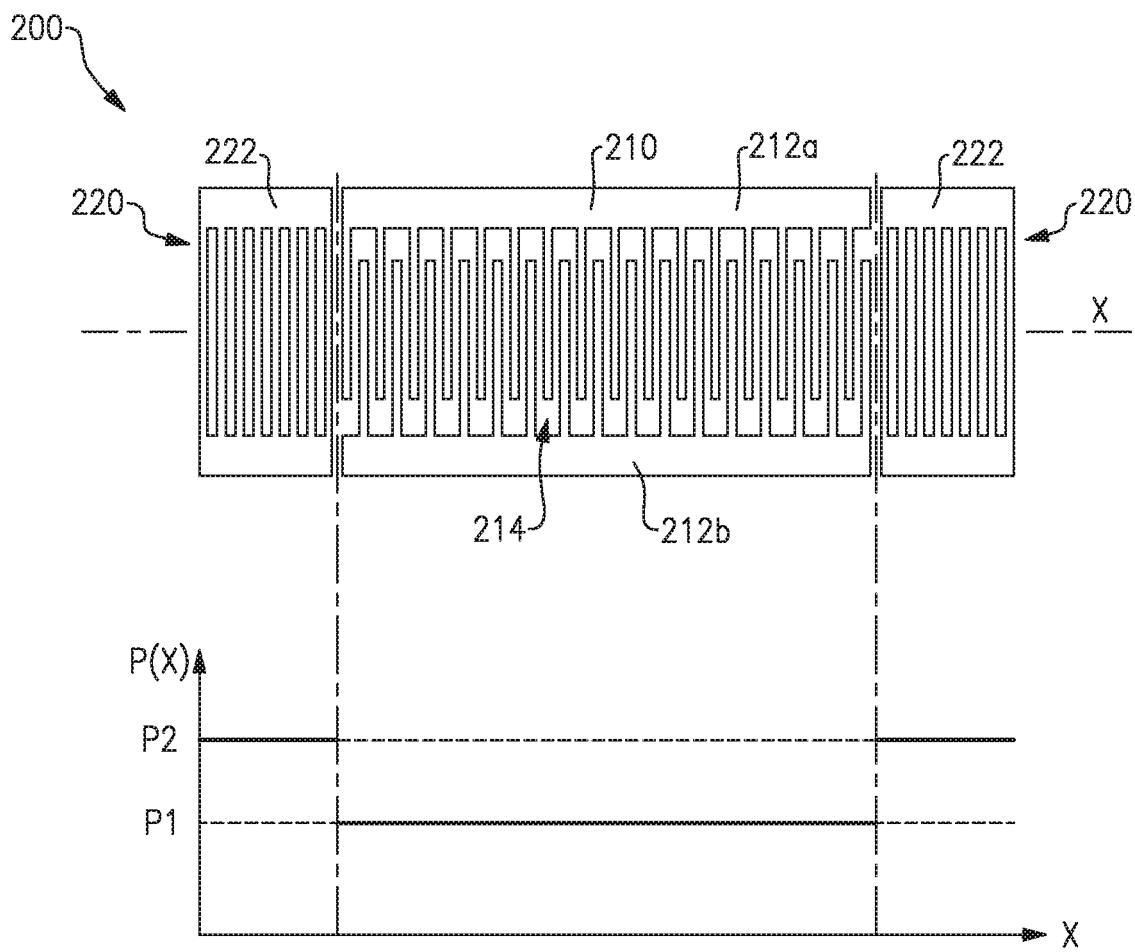
FIG. 2 is a diagram showing an electrode arrangement of a first example of a conventional SAW element.
Figure 3:
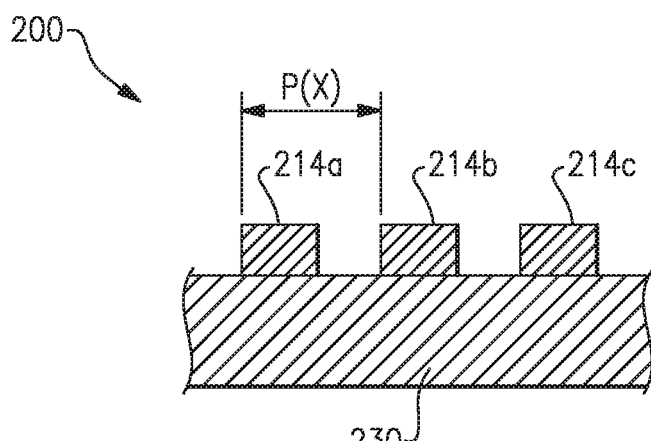
FIG. 3 is an enlarged cross-sectional view of a portion of the conventional SAW element shown in FIG. 2, illustrating a pitch P(x) of electrode fingers.
Figure 9A:
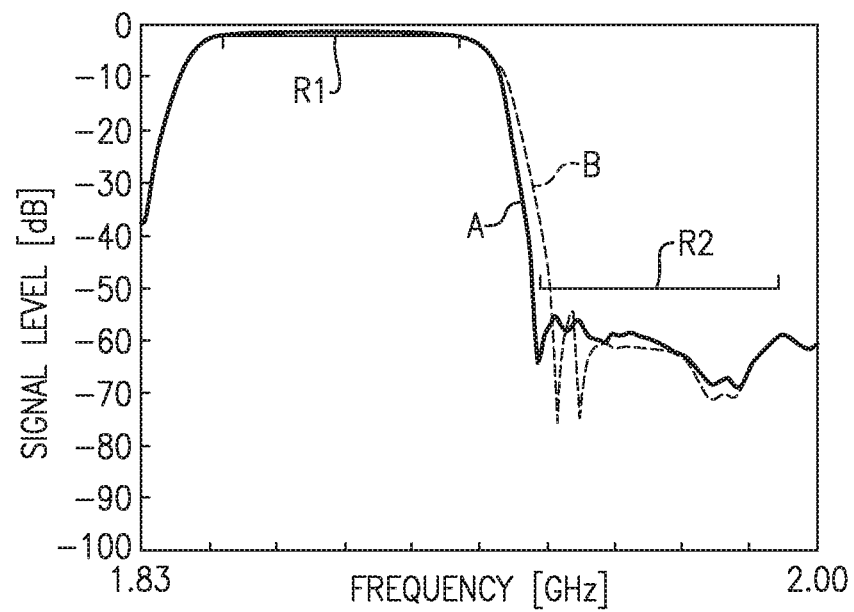
FIG. 9A is a graph showing comparative frequency characteristics of examples of ladder-type filters implemented using the SAW elements depicted in FIG. 4 and FIG. 7, respectively.
Figure 9B:
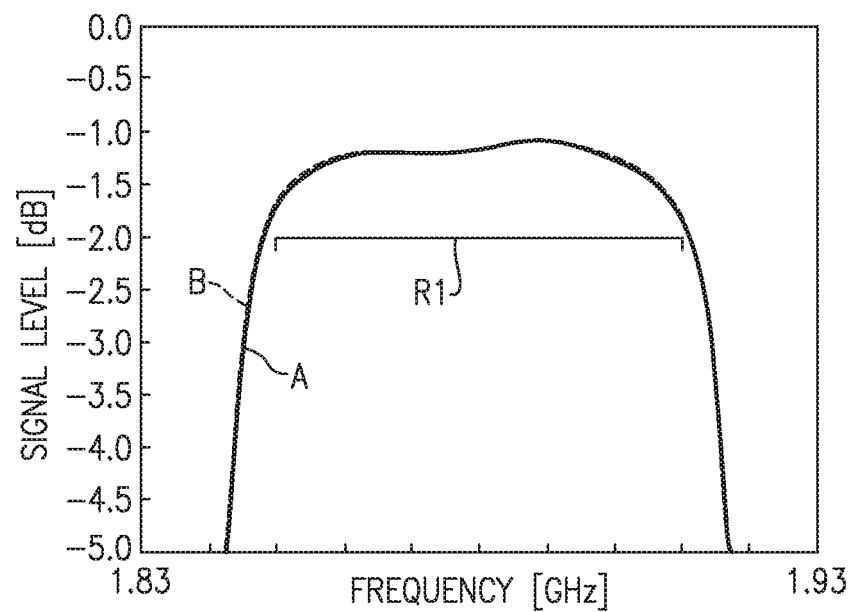
FIG. 9B is a graph showing an enlarged view of a portion of FIG. 9A.

FIGS. 9A and 9B are a set of graphs showing frequency characteristics of an example of the ladder-type filter 100 implemented using an embodiment of the SAW element 400, and a comparative example of the ladder-type filter 100 implemented using conventional SAW elements 200 (FIG. 2). In both FIG. 9A and FIG. 9B, the vertical axis represents signal level (in dB) and the horizontal axis represents frequency (in GHz). The solid line A indicates the frequency response of the example of the filter 100 implemented using the SAW elements 400 as the series-arm resonators 104. For comparison purposes, the dashed line B indicates the frequency response of the comparative example of the filter 100 implemented using the conventional SAW elements 200 as the series-arm resonators 104. In both examples of the filter 100, the conventional SAW elements 200 are used as the parallel-arm resonators 105.

Referring to FIG. 9A, a passband R1 and a stopband R2 of the examples of the filter 100 are shown. As can be seen, the signal level in the stopband R2 is improved in the example of the filter 100 implemented using the SAW elements 400, indicated by the solid line A, relative to the comparative example of the filter 100 implemented using the conventional SAW elements 200, indicated by the dashed line B. In particular, the example of the filter 100 implemented using the SAW elements 400, indicated by solid line A, shows an improvement of signal level in the stopband R2 compared to the comparative example of the filter 100 indicated by the dashed line B. For example, the stopband R2 of the example of the filter 100 using the SAW elements 400 begins closer to the passband R1, or at a lower frequency, relative to the comparative example of the filter 100, as may be seen by comparing solid line A and dashed line B, and the corresponding signal level reaches an attenuation level of around −50 [dB] at a lower frequency relative to the comparative example of the filter.

FIG. 9B depicts an enlarged view of a portion of the frequency band depicted in FIG. 9A including the passband R1. As can be seen, the example of the filter 100 implemented using the SAW elements 400 and corresponding to the solid line A exhibits a substantially flat frequency response within the passband R1, similar to the comparative example of the filter 100, demonstrating that the occurrence of spurious emissions can be suppressed.

Figure 10:
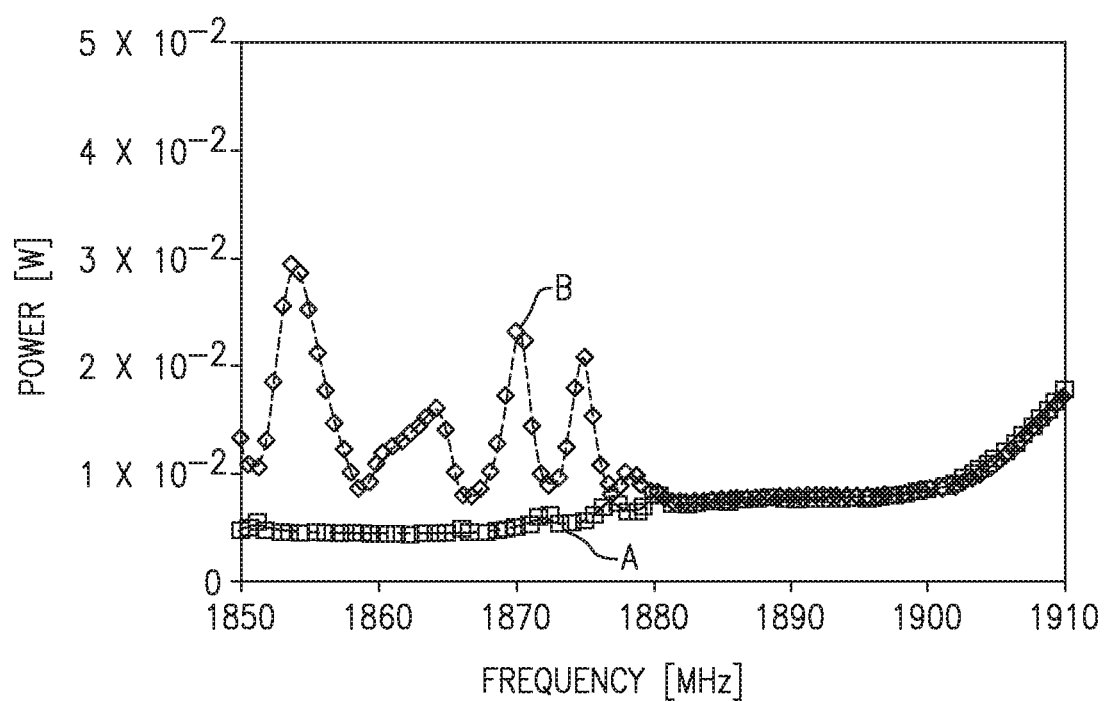
FIG. 10 is a graph showing electric power characteristics of a filter using the SAW element of FIG. 7 according to certain aspects.

FIG. 10 is a graph showing electric power characteristics of an example of the filter 100 implemented using SAW elements 400 (FIG. 7) as the series-arm resonators 104. The horizontal axis represents frequency, and the vertical axis represents electric power applied to the filter 100. A first data sequence (curve) A indicates the electric power applied to the example of the filter 100 over a certain frequency range. The applied electric power gently increases as the frequency is incremented from 1850 MHz to 1910 MHz. In general, the occurrence of spurious emissions may cause the electric power applied to a filter to concentrate or spike at one or more frequencies or frequency bands. These power spikes can place excessive strain on one or more components within the filter and compromise an electric power durability associated with the filter. In the example of the filter 100 represented by data sequence A, there is no point within the passband at which the electric power noticeably concentrates due to the lack of spurious emissions and therefore the electric power durability characteristics of this filter can be ensured.

Figure 6A:
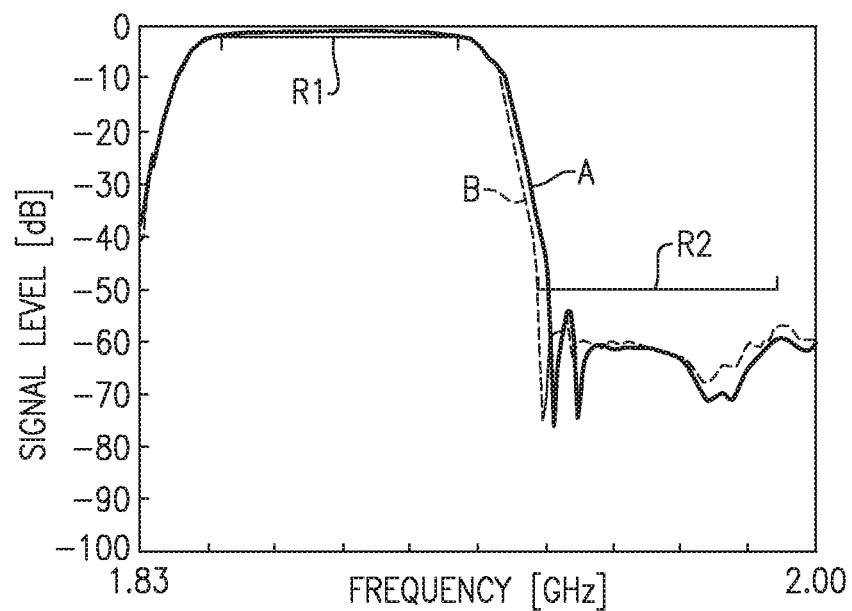
FIG. 6A is a graph depicting frequency characteristics of filters including the conventional SAW elements shown in FIG. 2 and FIG. 4.
Figure 6B:
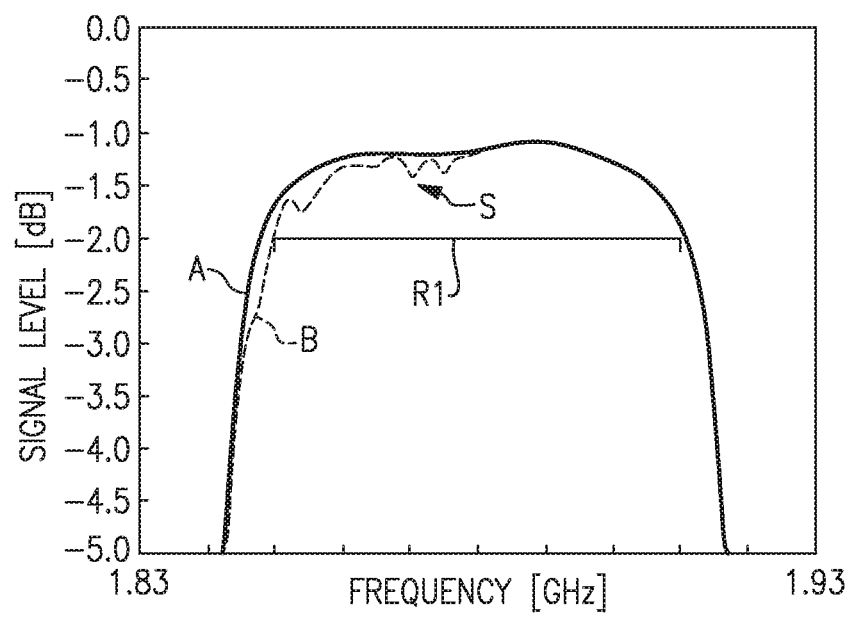
FIG. 6B is a graph showing an enlarged view of a portion of the graph of FIG. 6A.

For comparison purposes, a data sequence B indicates the electric power applied to a comparative example of the filter 100 implemented using the conventional SAW elements 300 (FIG. 4) as the series-arm resonators 104. The applied electric power can be seen spiking at various positions within the frequency band ranging from 1850 MHz to 1880 MHz due to the occurrence of spurious emissions. This behavior results from heat generation caused by the electric power concentrating at the spurious emissions occurring within the passband of the filter corresponding to the data sequence B (see dashed line B in FIG. 6B showing the spurious emissions S caused by the conventional SAW elements 300).

Figure 11:
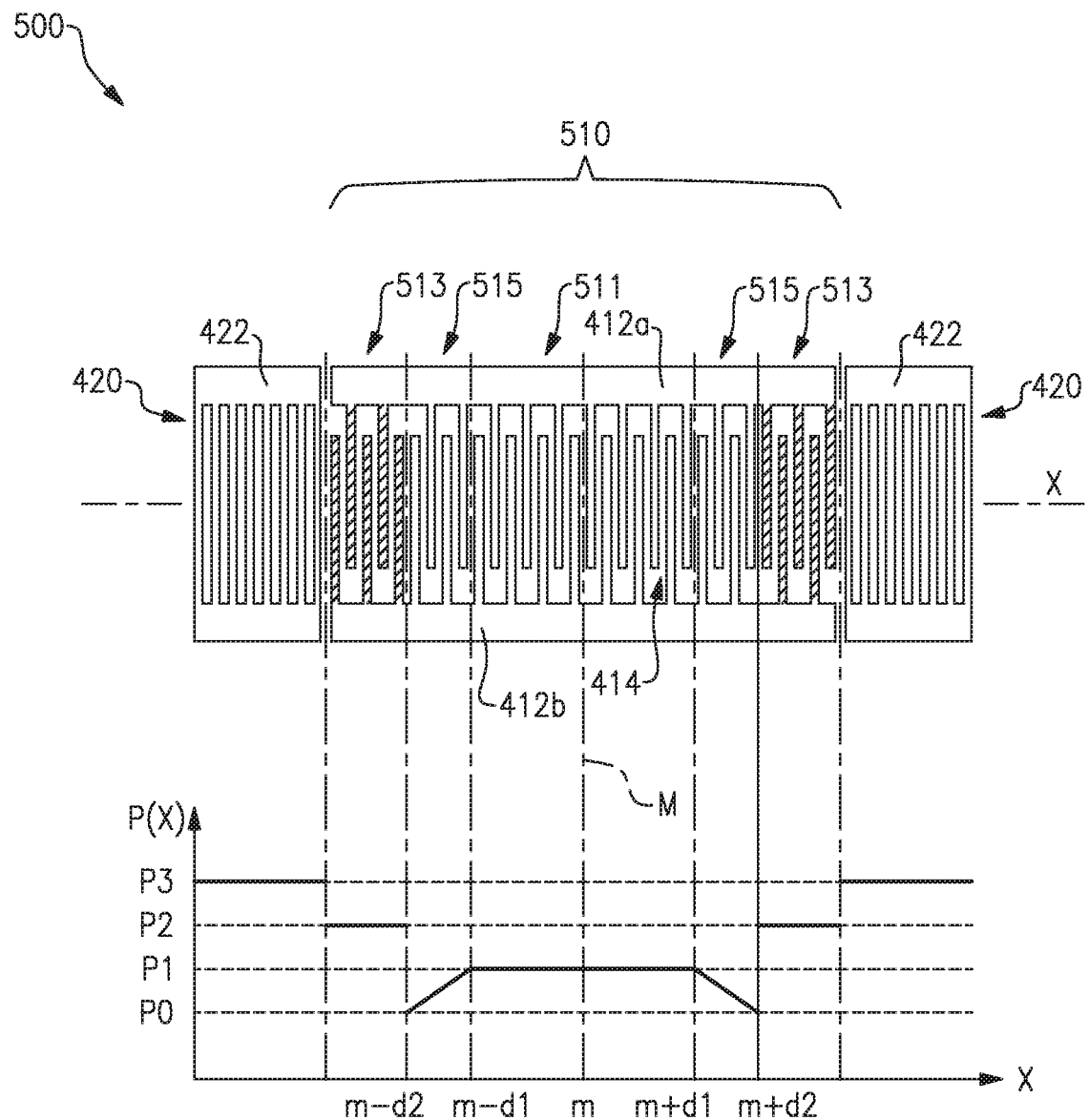
FIG. 11 is a diagram showing an electrode arrangement of another example of an improved SAW element according to certain aspects.
Figure 12:
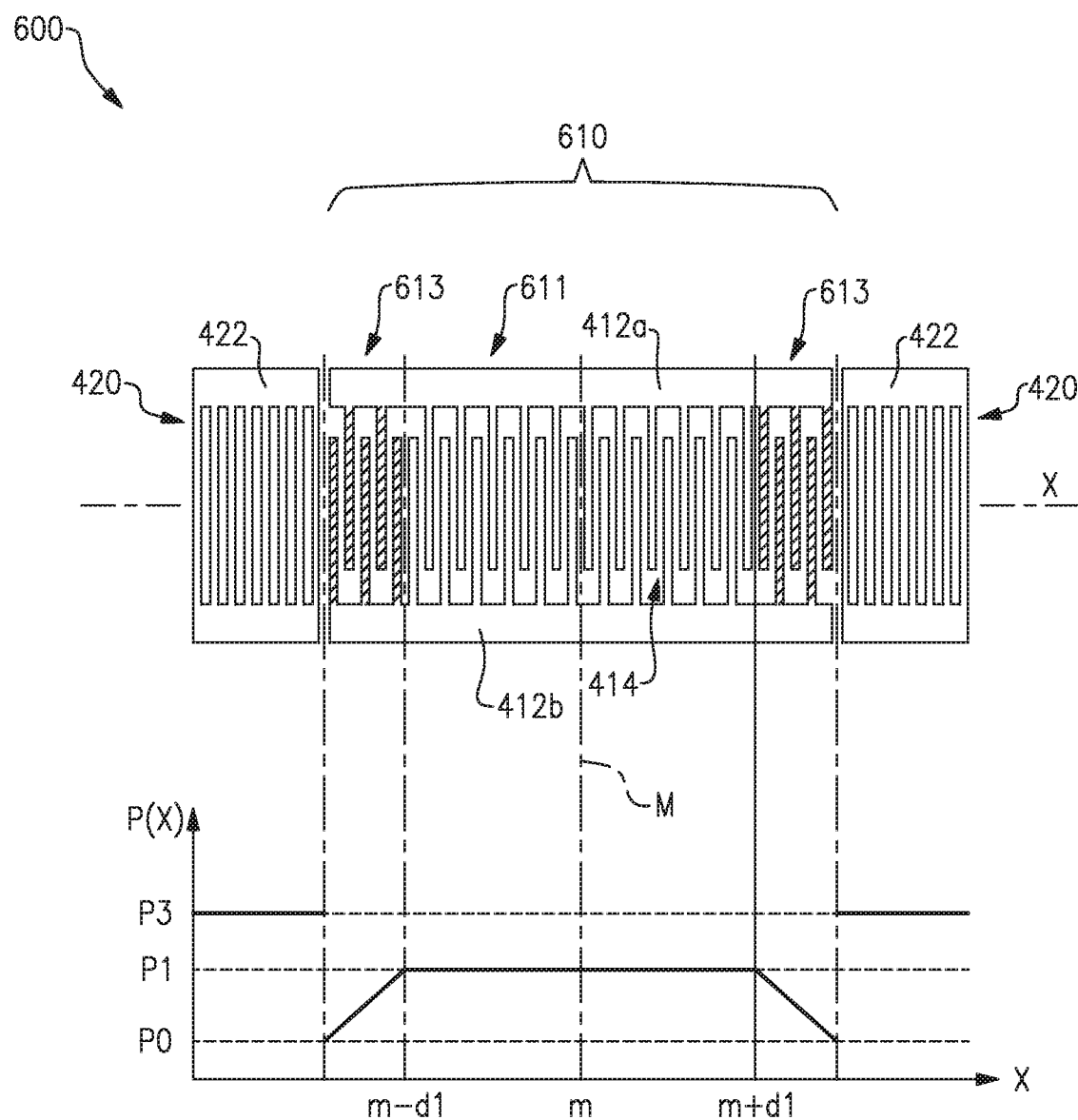
FIG. 12 is a diagram showing an electrode arrangement of another example of an improved SAW element according to certain aspects.
Figure 13:
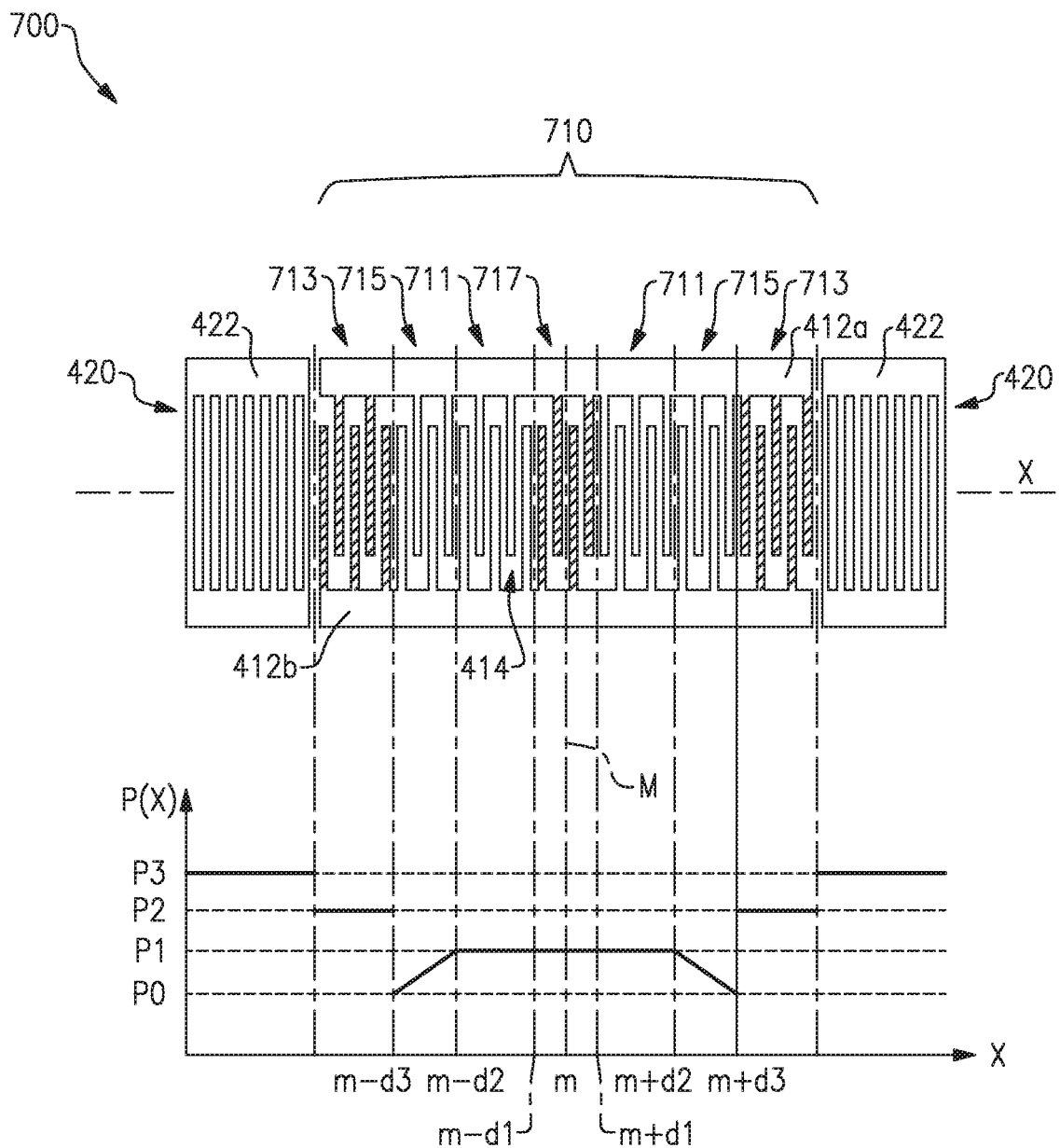
FIG. 13 is a diagram showing an electrode arrangement of another example of an improved SAW element according to certain aspects.

Thus, aspects and embodiments provide an improved SAW element 400 that can allow a filter in which it is used to have improved frequency response characteristics, and is also configured to suppress spurious emissions otherwise resulting from non-periodicity in the electrode finger connections. Those skilled in the art will appreciate, given the benefit of this disclosure, that variations of the improved SAW element 400 can also be implemented. For example, FIGS. 11-13 illustrate variations in the electrode finger arrangements of embodiments of improved SAW elements according to aspects of the present invention. The SAW elements 500, 600, and 700 shown in FIGS. 11-13, respectively, are similar to the SAW element 400 shown in FIG. 7, except for the inclusion of one or more additional or different regions, as described below.

Referring to FIG. 11 there is illustrated an electrode arrangement of an example of an improved SAW element 500 according to certain aspects. The upper portion of FIG. 11 shows a plan view of the SAW element 500, and the lower portion of FIG. 11 is a graph showing a distribution of pitches, P(x), of the electrode fingers in certain regions of the SAW element 500. As noted above, it is to be appreciated that FIG. 11 is not drawn to scale. Similar to the SAW element 400 shown in FIG. 7, the SAW element 500 includes an IDT electrode 510 that excites an acoustic wave propagating in the x-direction, and a pair of reflectors 420 disposed opposing one another on opposite sides of the IDT electrode 510. The IDT electrode 510 includes a normal region 511 that extends symmetrically from the reference point m to points a distance d1 away therefrom, as shown. The electrode fingers 414 in the normal region 511 have normal connections and a first electrode finger pitch P1. The IDT electrode 510 further includes two variable pitch regions 515 that extend from the points m±d1 outward along the x-direction to points m±d2, respectively. Reversed regions 513 of SAW element 500, in which the electrode fingers 414 have reversed connections, begin at the boundaries m+d2 and m−d2 and extend in each direction along the x-axis until terminating at corresponding ends of the IDT electrode 510, as shown in FIG. 11. Thus, the variable pitch regions 515 are positioned between the normal region 511 and the two reversed regions 513. The variable pitch regions 515 begin at the boundaries m+d1 and m−d1 and extend in the x-direction to the boundaries m+d2 and m−d12, respectively.

In the normal region 511, the electrode fingers 414 have a constant first electrode finger pitch P1 throughout the region. As shown in FIG. 11, in the variable pitch regions 515 the electrode fingers 414 have normal connections, and are arranged with pitches that gradually decrease from the first electrode finger pitch P1 (at points m±d1) to a minimum pitch P0 (at points m±d2) as the distance along the x-axis away from the reference point m increases. In the reversed regions 513 the electrode fingers 414 are arranged with a constant second electrode finger pitch P2. The pitch P2 is greater than the pitch P1, as indicated by the graph in the lower portion of FIG. 11. As in the embodiment of the SAW element 400 shown in FIG. 7, the reflector electrode fingers 422 in the reflectors 420 of the SAW element 500 are arranged with a constant third pitch P3 that is greater than the second pitch P2. Thus, in the SAW element 500, P3>P2>P1>P0.

In some embodiments, the electrode finger pitch in the variable pitch regions 515 decrements by a certain constant value at each successive finger 414 from the points m±d1 to m±d2. This constant value is determined by dividing the difference between pitches P1 and P0 by the number of IDT electrode fingers 414 in each variable pitch region 515. Thus, with this arrangement, the electrode finger pitch can be said to increase/decrease continuously with distance over each variable pitch region 515, as shown in FIG. 11. In other examples the electrode finger pitch in the variable pitch regions 515 can change in a step-wise manner so as to include two or more different pitches. For example, a certain number of the electrode fingers 414 in each variable pitch region 515 may have the first pitch P1 and the remainder may have the minimum pitch P0. In another example, a certain number of the electrode fingers 414 closer to the points m±d1 in each variable pitch region may have the first pitch P1, a certain other number of electrode fingers 414 closer to the points m±d2 may have the minimum pitch P0, and a remaining "central" number of electrode fingers in each variable pitch region 515 may have a pitch that is greater than P0 but less than P1. Given the benefit of this disclosure, those skilled in the art will appreciate that a variety of other pitch arrangements can be implemented in the variable pitch regions 515.

The SAW element 500, like the SAW element 400 shown in FIG. 7, may similarly allow the electromechanical coupling coefficient to be modified such that the occurrence of spurious emissions in the passband of the filter is suppressed.

FIG. 12 illustrates another example of an improved SAW element 600 according to certain aspects. Similar to the SAW elements 400 and 500 discussed above, the SAW element 600 includes an IDT electrode 610 that excites an acoustic wave propagating in the x-direction, and a pair of reflectors 420 that are disposed opposing one another on opposite sides of the IDT electrode 610 in the x-direction and reflect the acoustic wave. As noted above, FIG. 12 is not drawn to scale.

As shown in FIG. 12, the IDT electrode 610 includes a normal region 611 extending from the reference point m to points a distance d1 away therefrom. The electrode fingers 414 in the normal region 611 have normal connections and are arranged with a first electrode finger pitch P1. The IDT electrode 610 further includes reversed regions 613, similar to the reversed regions 413 in the SAW element 400, in which the electrode fingers 414 are connected with reversed connections. The electrode fingers 414 in the reversed regions 613 are shown hatched to indicate the reversed connections. The reversed regions 613 begin at the points m±d1 and extend toward the reflectors 420 in the x-direction until terminating at each end of the IDT electrode 610. In this example, the reversed regions 613 are also variable pitch regions in which the electrode fingers 414 are arranged with pitches gradually decreasing from the first pitch P1 to a minimum pitch P0 as the distance along the x-direction away from the reference point m increases. In this example, when the symmetry axis M is set as a reference, the width of the each of the reversed regions 613 is substantially less than the width of the normal region 611 in the x-direction. The reflector electrode fingers 422 in the reflectors 420 of the SAW element 600 are arranged with a third electrode finger pitch P3 that is greater than the first electrode finger pitch P1 and the minimum electrode finger pitch P0, as shown in the graph portion of FIG. 12. As discussed above with reference to FIG. 11 and the variable pitch regions 515 of the SAW element 500, the pitch of the electrode fingers 414 in the variable pitch reversed regions 613 can vary "continuously" as shown, or in a stepwise manner to include two or more different pitches.

The SAW element 600, like the SAW element 400 shown in FIG. 7, may similarly allow the electromechanical coupling coefficient to be controlled such that the occurrence of spurious emissions in the passband of the filter is suppressed.

Referring now to FIG. 13, there is illustrated an electrode arrangement of another example of an improved SAW element 700. The top portion of FIG. 13 is a plan view of the SAW element 700, and the lower portion of FIG. 13 is a graph showing the distribution of the electrode finger pitches, P(x). As noted above, FIG. 13 is not drawn to scale. Similar to the SAW elements 400, 500, and 600 discussed above, the SAW element 700 includes an IDT electrode 710 that excites an acoustic wave propagating in the x-direction, and a pair of reflectors 420 that are disposed opposing one another on opposite sides of the IDT electrode 710 in the x-direction and reflect the acoustic wave.

As shown in FIG. 13, in this example the SAW element 700 includes multiple normal and reversed regions. In particular, the SAW element 700 includes normal regions 711 and 715 that are disposed between reversed regions 713 and 717 in which the electrode finger connections are reversed relative to the electrode finger connections in the normal regions, as discussed above. As shown in FIG. 13, the IDT electrode 710 includes a first reversed region 717 that is symmetrically arranged about the reference point m, extending a distance d1 away therefrom. Thus, the first reversed region 717 spans the region from m−d1 to m+d1. In the first reversed region 717, the electrode fingers 414 have reversed connections and are arranged with a constant first pitch, P1. The electrode fingers 414 in the first reversed region 717 are shown hatched to indicate the reversed connections.

The IDT electrode 710 includes first normal regions 711 positioned on either side of the first reversed region 717. The first normal regions 711 extend from boundaries m+d1 and m−d1 along the x-direction to boundaries m+d2 and m−d2, respectively. In the first normal regions 711 the electrode fingers 414 have normal connections and are arranged with the constant first pitch, P1.

The IDT electrode 710 further includes second normal regions 715 positioned adjacent the first normal regions 711, as shown in FIG. 13. The second normal regions 715 extend from boundaries m+d2 and m−d2 along the x-direction to boundaries m+d3 and m−d3, respectively. In the second normal regions 715 the electrode fingers 414 have normal connections and are arranged with a varying pitch. In the illustrated example, the electrode finger pitch P(x) in the second normal regions varies continuously and linearly between the first pitch, P1, and a minimum pitch, P0. In this example, the electrode finger pitch P(x) in the second normal regions decreases with increasing distance along the x-direction away from the reference point m. In some embodiments, the electrode finger pitch P(x) in the second normal regions 715 decrements by a certain constant value at each successive electrode finger 414 from the points m±d2 to m±d3. This constant value may be determined by dividing the difference between pitches P1 and P0 by the number of IDT electrode fingers 414 in each second normal region 715. Thus, with this arrangement, the electrode finger pitch can be said to increase/decrease continuously with distance over each second normal region 715, as shown in FIG. 13. In other examples the electrode finger pitch in the second normal regions 715 can change in a step-wise manner so as to include two or more different pitches. For example, a certain number of the electrode fingers 414 in each second normal region 715 may have the first pitch P1 and the remainder may have the minimum pitch P0. In another example, a certain number of the electrode fingers 414 closer to the points m±d2 in each second normal region may have the first pitch P1, a certain other number of electrode fingers 414 closer to the points m±d3 may have the minimum pitch P0, and a remaining "central" number of electrode fingers in each second normal region 715 may have a pitch that is greater than P0 but less than P1. Given the benefit of this disclosure, those skilled in the art will appreciate that a variety of other pitch arrangements can be implemented in the second normal regions 715.

The IDT electrode 710 further includes second reversed regions 713 in which the electrode fingers 414 have reversed connections. The electrode fingers 414 in the second reversed regions 713 are shown hatched to indicate the reversed connections. The second reversed regions 713 begin at the boundaries m+d3 and m−d3, respectively, and span in each direction along the x-axis until terminating at respective ends of the IDT electrode 710. Thus, the second reversed regions 713 are positioned between the second normal regions 715 and the reflectors 420 along the x-direction, as shown in FIG. 13. In the second reversed regions 713, the electrode fingers 414 are arranged with a second constant pitch P2. In the illustrated example, the second pitch P2 is greater than the first pitch P1.

In addition, the reflector electrode finger 422 are arranged with a third constant pitch P3. In the illustrated example the third pitch P3 is greater than the second pitch P2. Thus, in this example, P3>P2>P1>P0.

For the example of the SAW element 700 shown in FIG. 13, when the symmetry axis M is set as a reference, the widths of the first reversed region 717, each first normal region 711, each second normal region 715, and each second reversed region 713 are substantially the same. The SAW element 700, like the SAW elements 400, 500, and 600 discussed above, may similarly allow the electromechanical coupling coefficient to be controlled such that the occurrence of spurious emissions in the passband of the filter is suppressed.

Although the above-discussed embodiments of the SAW elements 400, 500, 600, and 700 have been described and illustrated as having IDT electrode regions and reflectors 420 that are symmetrically arranged with respect to the symmetry axis M passing perpendicular to the x-direction through the reference position m corresponding to the midpoint of the IDT electrodes 410, 510, 610, and 710, respectively, other embodiments may have other configurations. For example, the various regions defining the electrode finger pitches and/or connections in any of the IDT electrodes 410, 510, 610, and 710 may be arranged asymmetrically rather than symmetrically with respect to the reference position m, which need not correspond to the midpoint of the IDT electrode.

Figure 1:
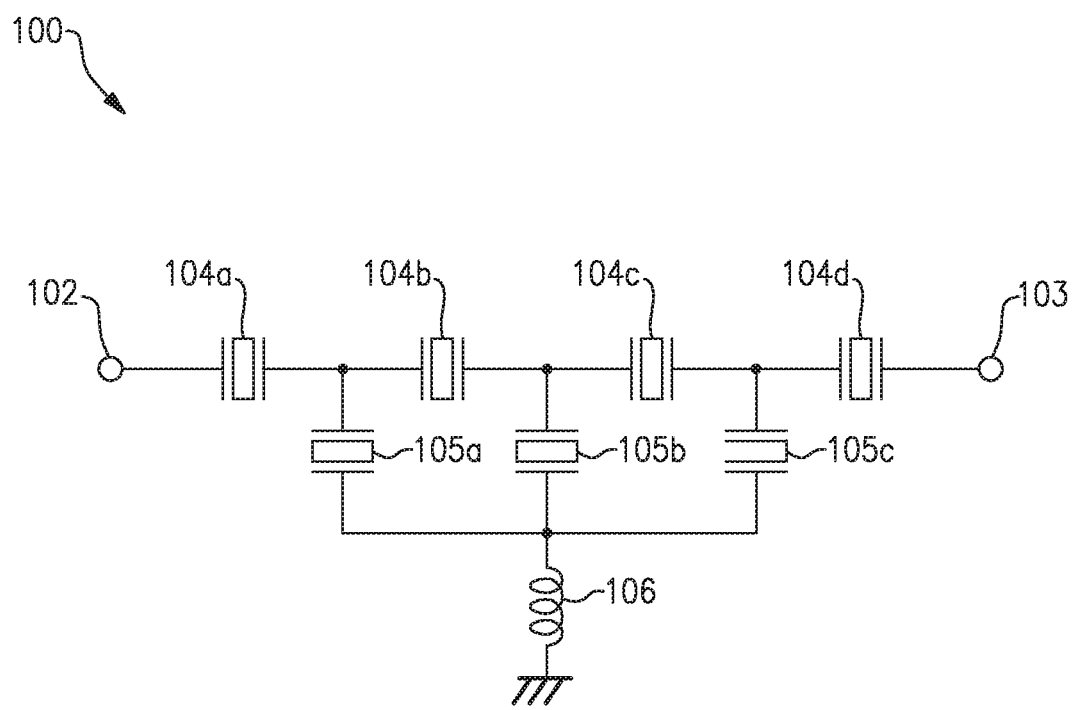
FIG. 1 is a circuit diagram showing a configuration of an example of a ladder-type filter.

As discussed above, the improved SAW elements 400, 500, 600, or 700 can be used in filters, such as the ladder-type filter 100 shown in FIG. 1. In certain examples the SAW elements 400, 500, 600, or 700 can be used as the series-arm resonators 104. In other examples, the SAW elements 400, 500, 600, or 700 can be used as one or more of the series-arm resonators 104 or the parallel-arm resonators 105. The SAW elements 400, 500, 600, or 700 can also be used in other types and configurations of filters, not limited to the ladder-type arrangement shown in FIG. 1. Filters incorporating the SAW elements 400, 500, 600, or 700 can be used to provide filtering functions in a wide variety of electronic components. As discussed above, one device in which such filters may be used is an antenna duplexer, which itself can be incorporated into a variety of electronic devices, such as RF front-end modules and communication devices.

Figure 14:
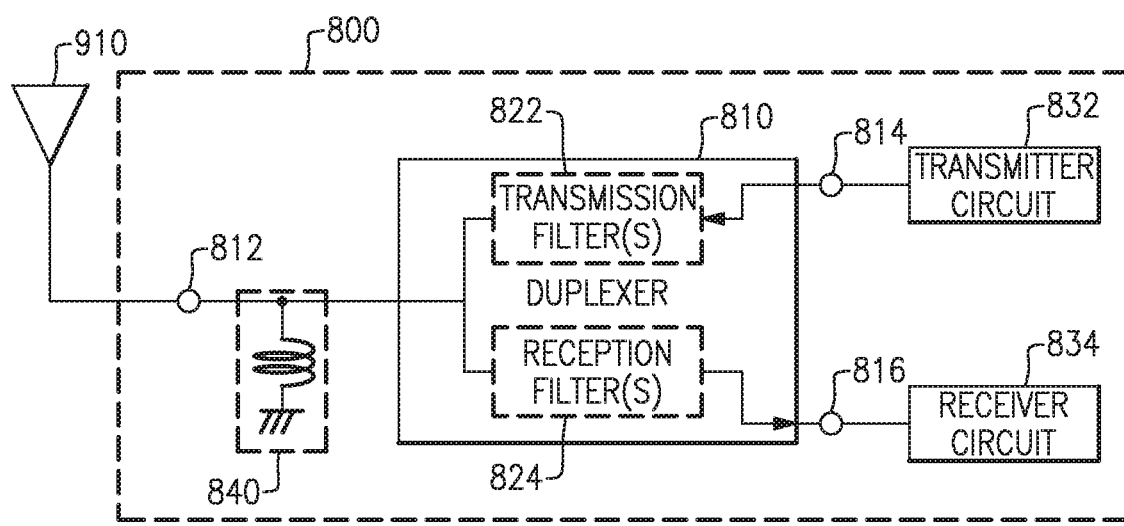
FIG. 14 is a block diagram of one example of a front-end module for an electronic device including an antenna duplexer having filters in which embodiments of the SAW elements of FIGS. 7 and 11-13 may be used.

Referring to FIG. 14, there is illustrated a block diagram of one example of a front-end module 800, which may be used in an electronic device such as a wireless communications device (e.g., a mobile phone) for example. The front-end module 800 includes an antenna duplexer 810 having a common node 812, an input node 814, and an output node 816. An antenna 910 is connected to the common node 812. The front-end module 800 further includes a transmitter circuit 832 connected to the input node 814 of the duplexer 810 and a receiver circuit 834 connected to the output node 816 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 14, however in other embodiments these components may be integrated into a common transceiver circuit or module. As will be appreciated by those skilled in the art, the front-end module 800 may include other components that are not illustrated in FIG. 14 including, but not limited to, switches, electromagnetic couplers, amplifiers, processors, and the like.

The antenna duplexer 810 may include one or more transmission filters 822 connected between the input node 814 and the common node 812, and one or more reception filters 824 connected between the common node 812 and the output node 816. The passband(s) of the transmission filter(s) are different from the passband(s) of the reception filters. Each of the transmission filter(s) 822 and the reception filter(s) 824 may be a ladder-type filter 100, such as that shown in FIG. 1. An inductor or other matching component 840 may be connected at the common node 812. The isolation characteristic of the duplexer 810 refers to the passing characteristic from the input node 814 to the output node 816. An improved isolation characteristic can be obtained in the passbands of the filters 822 and 824 by reducing a level of signal that passes between the input node 814 and the output node 816. One manner by which this can be achieved is to improve signal attenuation in the stopband(s) of at least one of the filters 822 and 824.

As discussed above, the SAW elements 400, 500, 600, and 700 (shown in FIGS. 7, 11-13, respectively) are each configured to improve signal attenuation in the filter stopband relative to the conventional SAW element 200 shown in FIG. 2. In addition, unlike the conventional SAW element 300 shown in FIG. 4, the SAW elements 400, 500, 600, and 700 do not produce noticeable spurious emissions in the filter passband. Accordingly, to improve the signal attenuation in the stopband(s) of the filters 822 or 824, one or more SAW elements 400, 500, 600, or 700 may be used in these filters. In certain examples, either or both of the filters 822 and 824 can be implemented as a ladder-type filter, such as that shown in FIG. 1, and SAW elements 400, 500, 600, or 700 may be used as one or more of the series-arm resonators 104 and/or parallel-arm resonators 105. Accordingly, by using the SAW elements 400, 500, 600, or 700, the isolation characteristics of the duplexer 800 may be improved without causing spurious emissions that would degrade the passing characteristics of the transmission or reception filters 822, 824. In certain examples, the SAW elements used in the transmission filter 822 or the reception filter 824 are disposed on a single piezoelectric substrate. This structure reduces the effect of changes in temperature upon the frequency responses of the respective filter, in particular, reducing degradation in the passing or attenuation characteristics due to changes in the temperature, because each SAW element changes similarly in response to changes in the ambient temperature. In addition, this arrangement may also allow the transmission filter 822 or reception filter 824 to have a small size.

Figure 15:
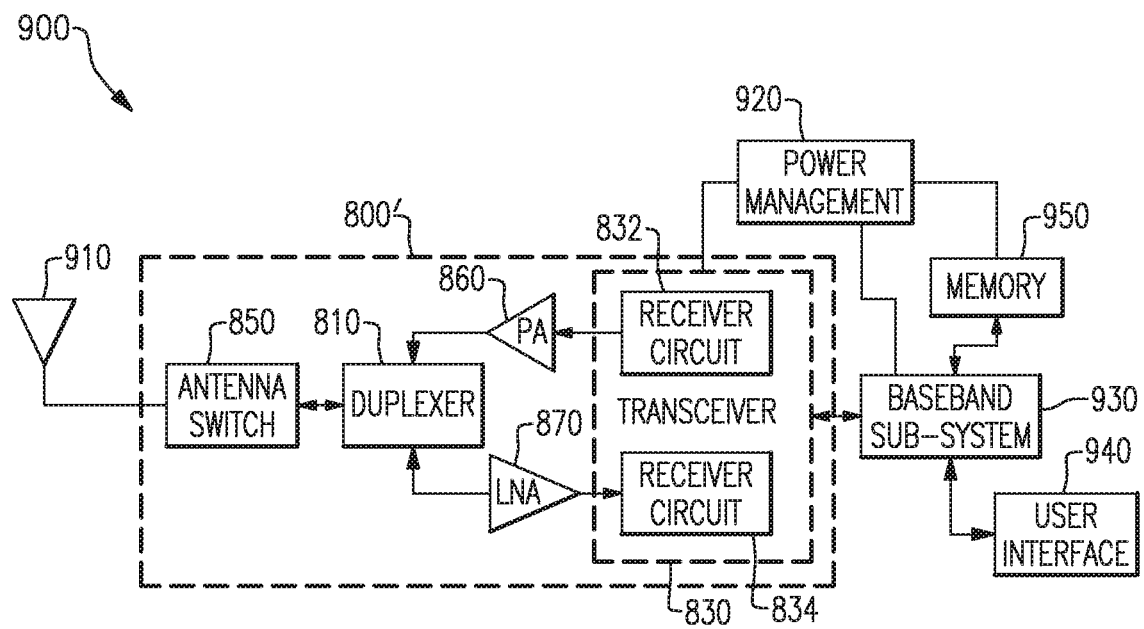
FIG. 15 is a block diagram of an example of an electronic device including the antenna duplexer according to certain aspects.

FIG. 15 is a block diagram of one example of a wireless device 900 including the antenna duplexer 810 shown in FIG. 14. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800' similar to that discussed above with reference to FIG. 14. The front-end module 800' includes the duplexer 810, as discussed above. In the example shown in FIG. 15 the front-end module 800' further includes an antenna switch 850, which can be configured to switch between different frequency bands or modes, such as transmit and receive modes, for example. In the example illustrated in FIG. 15, the antenna switch 850 is positioned between the duplexer 810 and the antenna 910; however, in other examples the duplexer 810 can be positioned between the antenna switch 850 and the antenna 910. In other examples the antenna switch 850 and the duplexer 810 can be integrated into a single component.

The front end module 800' includes a transceiver 830 that is configured to generate signals for transmission or to process received signals. The transceiver 830 can include the transmitter circuit 832, which can be connected to the input node 814 of the duplexer 810, and the receiver circuit 834, which can be connected to the output node 816 of the duplexer 810, as shown in the example of FIG. 14.

Signals generated for transmission by the transmitter circuit 832 are received by a power amplifier (PA) module 860, which amplifies the generated signals from the transceiver 830. The power amplifier module 860 can include one or more power amplifiers. The power amplifier module 860 can be used to amplify a wide variety of RF or other frequency-band transmission signals. For example, the power amplifier module 860 can receive an enable signal that can be used to pulse the output of the power amplifier to aid in transmitting a wireless local area network (WLAN) signal or any other suitable pulsed signal. The power amplifier module 860 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 860 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 15, the front-end module 800' may further include a low noise amplifier module 870, which amplifies received signals from the antenna 910 and provides the amplified signals to the receiver circuit 834 of the transceiver 830.

The wireless device 900 of FIG. 15 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A surface acoustic wave element comprising:
a piezoelectric substrate;
an interdigital transducer (IDT) electrode formed on the piezoelectric substrate, the IDT electrode including a plurality of electrode fingers, a first busbar, and a second busbar, the IDT electrode further including a first region in which the plurality of electrode fingers of the IDT electrode are connected to the first and second busbars by normal connections, a second region in which the plurality of electrode fingers are connected to the first and second busbars by reversed connections, and a third region in which the electrode fingers are connected to the first and second busbars by normal connections, the normal connections having odd-numbered electrode fingers sequentially counted from one end of the IDT electrode in a propagation direction of a surface acoustic wave excited by the IDT electrode connected to the first busbar and even-numbered electrode fingers connected to the second busbar, and the reversed connections having the odd-numbered electrode fingers connected to the second busbar and the even-numbered electrode fingers connected to the first busbar, the plurality of electrode fingers being arranged with a first pitch in the first region and a second pitch in the second region, the second pitch being greater than the first pitch, the first and second regions being symmetrically arranged with respect to a single reference position in the IDT electrode along the propagation direction, and the reference position being a mid-point of the IDT electrode along the propagation direction, the first region extending symmetrically from the reference position to a pair of first points located a first distance away from the reference position along the propagation direction, the third region extending from each first point to a corresponding one of a pair of second points located a second distance away from the reference position along the propagation direction, and the second region extending from each second point to a respective end of the IDT electrode, the electrode fingers in the third region being arranged with a varying pitch that varies linearly with distance from the reference position from the first pitch at each first point to a third pitch at each second point, the third pitch being less than the first pitch; and
   a pair of reflectors disposed opposing one another on opposite sides of the IDT electrode in the propagation direction on the piezoelectric substrate.

2. The surface acoustic wave element of claim 1 wherein each reflector of the pair of reflectors includes a plurality of reflector fingers arranged with a fourth pitch greater than the second pitch.

3. The surface acoustic wave element of claim 2 wherein the first region has a first width in the propagation direction and the second region has a second width in the propagation direction, the first width being greater than the second width.

4. A ladder-type filter comprising:
an input and an output;
a piezoelectric substrate;
a plurality of series-arm resonators formed on the piezoelectric substrate and connected in series along a signal path between the input and the output, at least one of the series-arm resonators being implemented using a surface acoustic wave element including an interdigital transducer (IDT) electrode formed on the piezoelectric substrate and configured to excite an acoustic wave and a pair of reflectors disposed opposing one another on the piezoelectric substrate on opposite sides of the IDT electrode in a propagation direction of the acoustic wave, the IDT electrode having a plurality of electrode fingers, a first busbar, and a second busbar, the IDT electrode configured with a first region in which the plurality of electrode fingers of the IDT electrode are connected to the first and second busbars by normal connections, a second region in which the plurality of electrode fingers are connected to the first and second busbars by reversed connections, and a third region in which the electrode fingers are connected to the first and second busbars by the normal connections, the normal connections having odd-numbered electrode fingers sequentially counted in the propagation direction from one end of the IDT electrode connected to the first busbar and even-numbered electrode fingers connected to the second busbar, and the reversed connections having the odd-numbered electrode fingers connected to the second busbar and the even-numbered electrode fingers connected to the first busbar, the plurality of electrode fingers being arranged with a first pitch in the first region and a second pitch in the second region, the second pitch being greater than the first pitch, the first and second regions of the IDT electrode of the surface acoustic wave element being symmetrically arranged with respect to a single reference position in the IDT electrode along the propagation direction, the reference position being a mid-point of the IDT electrode along the propagation direction, the first region extending symmetrically from the reference position to a pair of first points located a first distance away from the reference position along the propagation direction, the third region extending from each first point to a corresponding one of a pair of second points located a second distance away from the reference position along the propagation direction, and the second region extending from each second point to a respective end of the IDT electrode, the electrode fingers in the third region being arranged with a varying pitch that varies linearly with distance from the reference position from the first pitch at each first point to a third pitch at each second point, the third pitch being less than the first pitch; and
   a plurality of parallel-arm resonators formed on the piezoelectric substrate and connected between the signal path and a reference potential, at least one of the parallel-arm resonators being implemented using the surface acoustic wave element.

5. The ladder-type filter of claim 4 wherein each reflector of the pair of reflectors includes a plurality of reflector fingers arranged with a fourth pitch greater than the second pitch.

* * * * *

UNITED STATES PATENT AND TRADEMARK OFFICE
CERTIFICATE OF CORRECTION

PATENT NO. : 10,530,331 B2
APPLICATION NO. : 15/718679
DATED : January 7, 2020
INVENTOR(S) : Toru Yamaji et al.

Page 1 of 1

It is certified that error appears in the above-identified patent and that said Letters Patent is hereby corrected as shown below:

On the Title Page

Item [72], delete "Toru Yamaji, Nagaokakyou (JP); Rei Goto, Osaka (JP)" and insert -- Toru Yamaji, Nagaokakyou-Shi (JP); Rei Goto, Osaka-Shi (JP) --

Signed and Sealed this
Eleventh Day of February, 2020

Andrei Iancu
*Director of the United States Patent and Trademark Office*